(12) United States Patent
Wong (10) Patent No.: US 11,644,250 B2
(45) Date of Patent: May 9, 2023

(54) VAPOR CHAMBER DEVICE

(71) Applicant: National Tsing Hua University, Hsinchu (TW)

(72) Inventor: Shwin-Chung Wong, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 241 days.

(21) Appl. No.: 16/782,020

(22) Filed: Feb. 4, 2020

(65) Prior Publication Data

US 2021/0180877 A1 Jun. 17, 2021

(30) Foreign Application Priority Data

Dec. 12, 2019 (TW) .................................. 108145459

(51) Int. Cl.
*F28D 15/04* (2006.01)
*H05K 7/20* (2006.01)
*F28D 15/02* (2006.01)

(52) U.S. Cl.
CPC ....... *F28D 15/046* (2013.01); *F28D 15/0233* (2013.01); *H05K 7/20336* (2013.01); *F28D 15/04* (2013.01)

(58) Field of Classification Search
CPC .... F28D 15/046; F28D 15/0233; F28D 15/04; H05K 7/20336

(Continued)

(56) References Cited

U.S. PATENT DOCUMENTS

2005/0280128 A1* 12/2005 Mok ..................... H01L 23/427
257/678
2010/0157535 A1* 6/2010 Oniki ................... F28D 15/046
361/700

(Continued)

FOREIGN PATENT DOCUMENTS

TW I285251 8/2007
TW M416757 11/2011

(Continued)

OTHER PUBLICATIONS

"Office Action of Taiwan Counterpart Application", dated Jul. 8, 2020, p. 1-p. 9.

*Primary Examiner* — Joel M Attey
(74) *Attorney, Agent, or Firm* — JCIPRNET (57) ABSTRACT

A vapor chamber device adapted to be thermally coupled to a heat source includes a first casing and a second casing. The first casing includes a first plate, a first capillary structure at an inner surface of the first plate, and a first lateral wall protruding from the inner surface and surrounding the first capillary structure. The heat source is adapted to contact an outer surface of the first plate. The second casing is stacked on the first casing and includes a second plate, a plurality of supporting posts protruding from the second plate, and a second lateral wall protruding from the second plate and surrounding the supporting posts. The supporting posts face towards the first capillary structure, and the first lateral wall is connected to the second lateral wall. The vapor chamber device includes a second capillary structure disposed between the first capillary structure and the supporting posts, and a third capillary structure disposed in an area which is at the inner surface of the first plate and corresponds to the heat source.

9 Claims, 11 Drawing Sheets

(58) Field of Classification Search
USPC .................................................. 165/104.26
See application file for complete search history.

(56) References Cited

U.S. PATENT DOCUMENTS

| 2013/0025829 | A1* | 1/2013 | Huang | F28D 15/0233 |
| | | | | 165/104.26 |
| 2018/0066898 | A1* | 3/2018 | Lin | F28D 15/0233 |
| 2019/0141855 | A1* | 5/2019 | Inagaki | H01L 23/427 |
| 2019/0271511 | A1* | 9/2019 | Kishimoto | F28D 15/04 |
| 2020/0333082 | A1* | 10/2020 | Wakaoka | F28D 15/04 |

FOREIGN PATENT DOCUMENTS

| TW | TM426988 | 4/2012 |
| TW | M429856 | 5/2012 |
| TW | I618907 | 3/2018 |
| WO | 2018199218 | 11/2018 |

\* cited by examiner

VAPOR CHAMBER DEVICE

CROSS-REFERENCE TO RELATED APPLICATION

This application claims the priority benefit of Taiwan application serial No. 108145459, filed on Dec. 12, 2019. The entirety of the above-mentioned patent application is hereby incorporated by reference herein and made a part of this specification.

BACKGROUND

Technical Field

The disclosure relates to a vapor chamber device, and in particular, to a high-efficacy vapor chamber device.

Description of Related Art

A vapor chamber is a common heat sink. The vapor chamber mainly includes a flat sealed casing, a capillary tissue formed in the flat sealed casing, and working fluid filling the flat sealed casing. The flat sealed casing contacts a heat source, e.g., a central processing unit (CPU), and dissipates heat for the heat source through a vapor-liquid phase change of the working fluid in the vapor chamber. How to improve heat dissipation capacity of the vapor chamber is to be researched in the field.

SUMMARY

The disclosure provides a vapor chamber device having a favorable heat dissipation effect.

A vapor chamber device provided in one embodiment of the disclosure includes working fluid and is adapted to be thermally coupled to a heat source. The vapor chamber device includes a first casing and a second casing. The first casing includes a first plate, a first capillary structure at an inner surface of the first plate, and a first lateral wall protruding from the inner surface and surrounding the first capillary structure, where the heat source is adapted to be in contact with an outer surface of the first plate. The second casing is stacked on the first casing and includes a second plate, a plurality of supporting posts protruding from the second plate, and a second lateral wall protruding from the second plate and surrounding the supporting posts, where a plurality of vapor channels are formed between the supporting posts. The supporting posts face towards the first capillary structure, and the first lateral wall is connected to the second lateral wall. The vapor chamber device further includes a second capillary structure and a third capillary structure. The second capillary structure is disposed between the first capillary structure and the supporting posts of the second casing. The third capillary structure is disposed in an area which is at the inner surface of the first plate and corresponds to the heat source.

In an embodiment of the disclosure, the first capillary structure includes a plurality of trenches formed between a plurality of protruding bars, and an area which is in the trenches and corresponds to the heat source is filled with the third capillary structure.

In an embodiment of the disclosure, the second capillary structure is a mesh structure woven by a plurality of wires and includes a plurality of holes, and the holes corresponding to the heat source and the trenches of the first capillary structure are filled with the third capillary structure.

In an embodiment of the disclosure, the second capillary structure has an opening corresponding to the heat source, and the opening and the trenches of first capillary structure are filled with the third capillary structure.

In an embodiment of the disclosure, the first plate has a cavity corresponding to the heat source, the first capillary structure is located outside the cavity, and the cavity is filled with the third capillary structure.

In an embodiment of the disclosure, the second capillary structure is a mesh structure woven by a plurality of wires and includes a plurality of holes, and the holes corresponding to the heat source are filled with the third capillary structure.

In an embodiment of the disclosure, the second capillary structure has an opening corresponding to the heat source, and the opening is filled with the third capillary structure.

In an embodiment of the disclosure, the supporting posts are evenly distributed on the second plate, and a cross-shaped vapor flow channel is formed between the supporting posts.

In an embodiment of the disclosure, the supporting posts include a plurality of first supporting posts and a plurality of second supporting posts, a shape of the first supporting post is different from the shape of the second supporting post, the first supporting posts are disposed corresponding to the heat source, and the second supporting posts are located beside the first supporting posts and extend along an axial direction. A cross-shaped vapor flow channel is formed between the supporting posts.

In an embodiment of the disclosure, one portion of the supporting posts is disposed corresponding to the heat source, the other portion of the supporting posts is radially arranged around the one portion of the supporting posts as a center, and a cross-shaped vapor flow channel is formed between the supporting posts.

In an embodiment of the disclosure, the supporting posts include a plurality of rectangular posts, a plurality of conical posts, a plurality of trapezoidal posts, a plurality of cylinders, or a plurality of irregular posts.

In an embodiment of the disclosure, the first capillary structure includes a plurality of trenches, and at least some of the trenches are radially arranged.

In an embodiment of the disclosure, the third capillary structure includes metal powders or non-woven metal wool.

Based on the above, for the vapor chamber device of the disclosure, in addition to the first capillary structure and the second capillary structure disposed between the first casing and the second casing to improve heat dissipation efficiency, the third capillary structure is further disposed in an area which is at the inner surface of the first plate and corresponds to the heat source. With the third capillary structure, the liquid disposed in the vapor chamber device may be subject to a greater capillary force, the trenches that are in the first capillary structure and that are covered by the second capillary structure have lower flow resistance, and the liquid may be more quickly supplemented to the area corresponding to the heat source, so as to improve the anti-drying capability of the area. Therefore, a sufficient amount of liquid may be maintained in the area for phase changes, and the drying tendency in the area may be reduced. Thereby, the vapor chamber device provided in one or more embodiments of the disclosure may have a better heat dissipation effect.

DESCRIPTION OF THE EMBODIMENTS

Figure 1A:
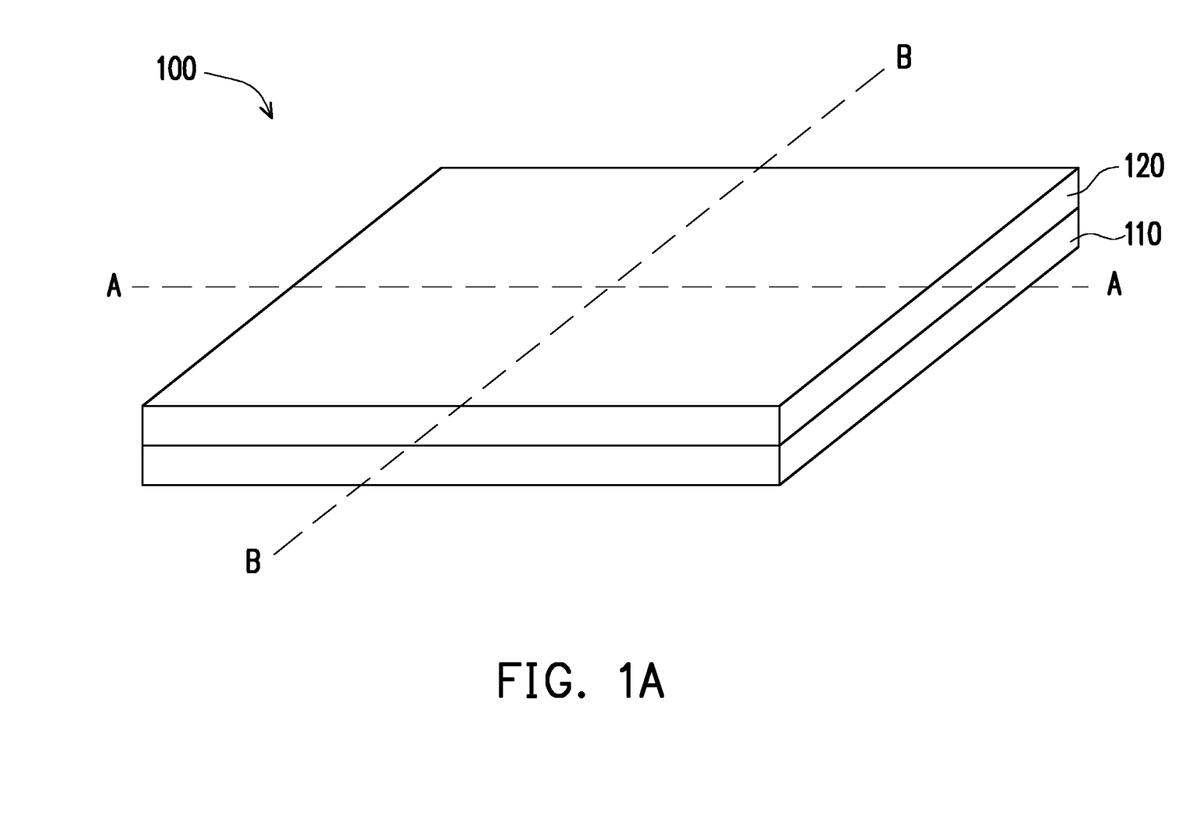
FIG. 1A is a schematic diagram of an appearance of a vapor chamber device according to an embodiment of the disclosure.
Figure 1B:
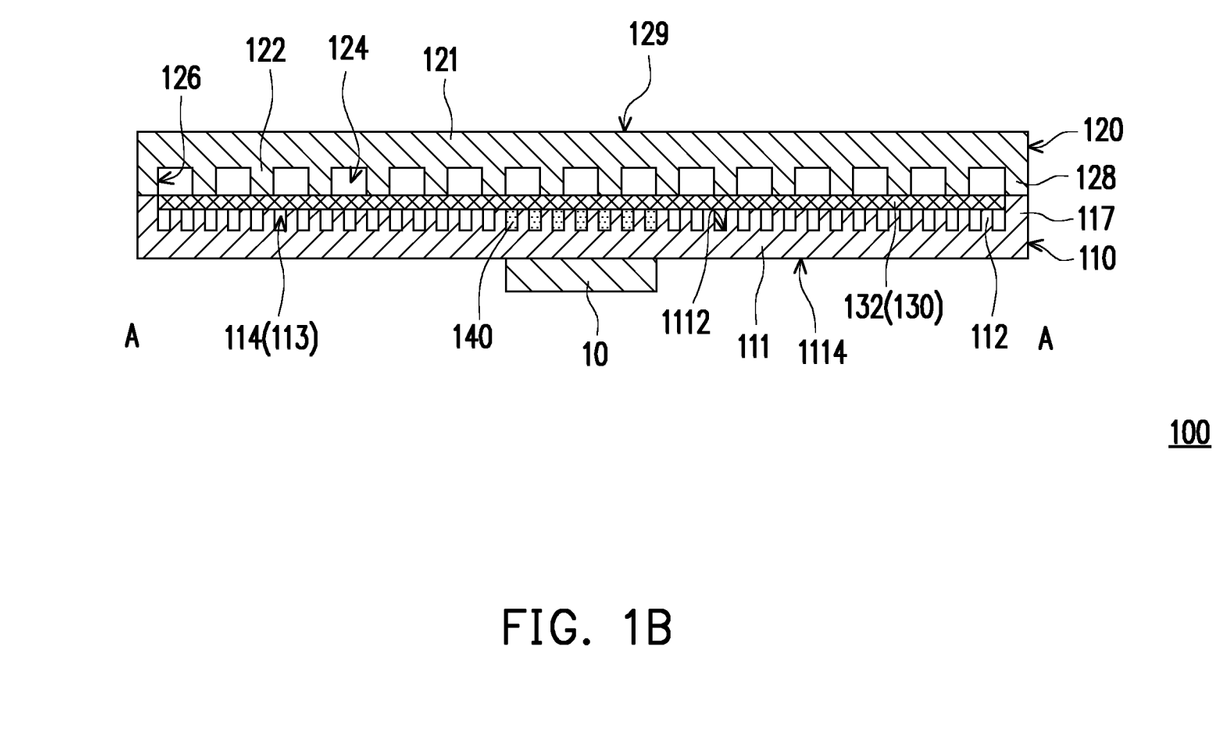
FIG. 1B is a schematic cross-sectional view of the vapor chamber device taken along line A-A of FIG. 1A.
Figure 1C:
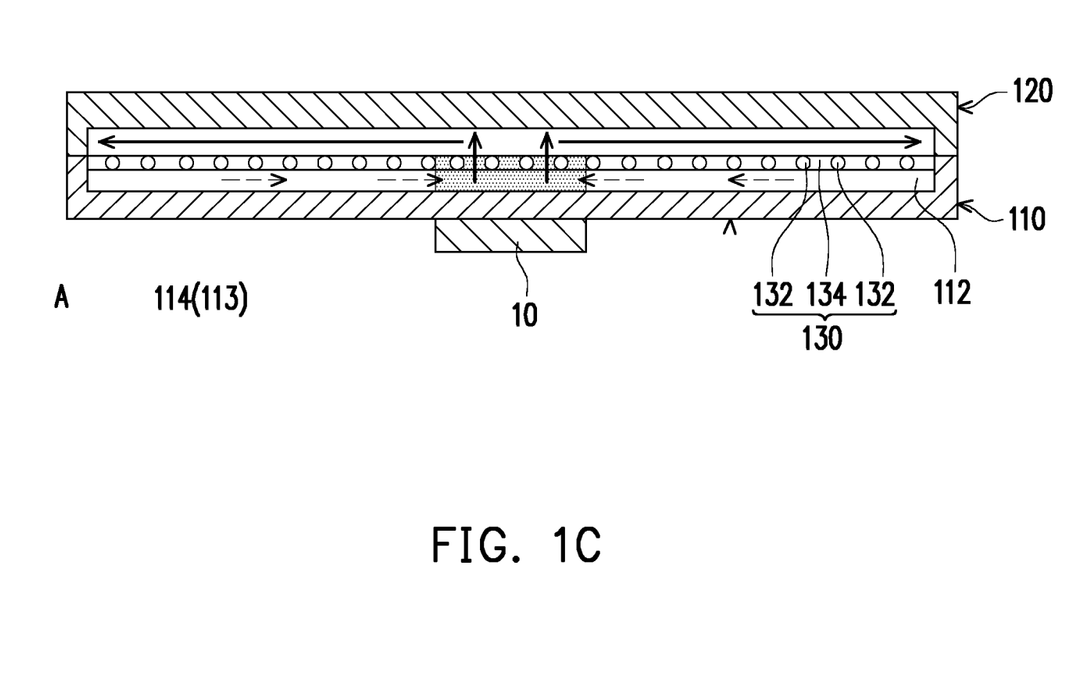
FIG. 1C is a schematic cross-sectional view of the vapor chamber device taken along line B-B of FIG. 1A.

FIG. 1A is a schematic diagram of an appearance of a vapor chamber device according to an embodiment of the disclosure. However, the shape of the appearance is not limited to a square plate shape and may be any shape. FIG. 1B is a schematic cross-sectional view of the vapor chamber device taken along line A-A of FIG. 1A. FIG. 1C is a schematic cross-sectional view of the vapor chamber device taken along line B-B of FIG. 1A.

With reference to FIG. 1A to FIG. 1C, a vapor chamber device 100 of the present embodiment is adapted to be thermally coupled to a heat source 10 (FIG. 1B). The heat source 10 is, for example, a central processing unit of a main board, but the heat source 10 may also be other chips, and the type and quantity of heat sources 10 are not limited thereto. The vapor chamber device 100 includes a first casing 110 and a second casing 120. As shown in FIG. 1B, the first casing 110 includes a first plate 111, a first capillary structure 113 at an inner surface 1112 of the first plate 111, and a first lateral wall 117 protruding from the inner surface 1112 and surrounding the first capillary structure 113. The heat source 10 is adapted to be in contact with an outer surface 1114 of the first casing of the first plate 111, and heat energy generated by the heat source 10 is transferred to the vapor chamber device 100.

As shown in FIG. 1B and FIG. 1C, the first capillary structure 113 includes a plurality of trenches 114 formed between a plurality of protruding bars 112. More specifically, the protruding bars 112 protrude from the inner surface 1112 of the first plate, so that trenches 114 are defined between two adjacent protruding bars 112. The design of the first capillary structure 113 using the trenches 114 may provide a smaller flow resistance. In the present embodiment, a width of the trench 114 is, for example, between 50 μm and 200 μm and a depth of the trench 114 is, for example, between 50 μm and 200 μm but the width and the depth of the trench 114 are not limited thereto. However, capillary force of a simple open trench is insufficient, and the simple open trench is not suitable for a non-horizontal vapor chamber device working against gravity. However, if a second capillary structure 130 is covered with a layer of mesh, it may not only maintain the advantage of low flow resistance of the trench, but also significantly improve capillary force, so that the vapor chamber device is adapted to be placed against gravity. If non-woven metal wool or metal powders with stronger capillary force are further added to the capillary structure near the heat source 10, the capillary force there may further be enhanced, and the anti-drying capability may be improved.

Therefore, as shown in FIG. 1B, the vapor chamber device 100 further includes a second capillary structure 130 and a third capillary structure 140 disposed near the corresponding heat source 10. The second capillary structure 130 is disposed between the first capillary structure 113 and supporting posts 122, to cover the first capillary structure 113 and strengthen the capillary and channel functions of the first capillary structure 113. The third capillary structure 140 is only disposed in the capillary structure near a position corresponding to the heat source 10, and does not block a path through which liquid passes when flowing back.

In addition, in the present embodiment, the first plate 111 and the protruding bars 112 are integrally formed, and such a design may have a relatively simple structure. Since there is no thermal contact resistance between the first plate 111 and the protruding bars 112 (that is, between the first plate 111 and the trenches 114), the heat transfer effect is better.

The second casing 120 is stacked on the first casing 110 and includes a second plate 121, a plurality of supporting posts 122 protruding from the second plate 121, and a second lateral wall 128 protruding from the second plate 121 and surrounding the supporting posts 122. In the present embodiment, the supporting posts 122 are flush with the second lateral wall 128, but a relationship between the supporting posts 122 and the second lateral wall 128 is not limited thereto.

Figure 1D:
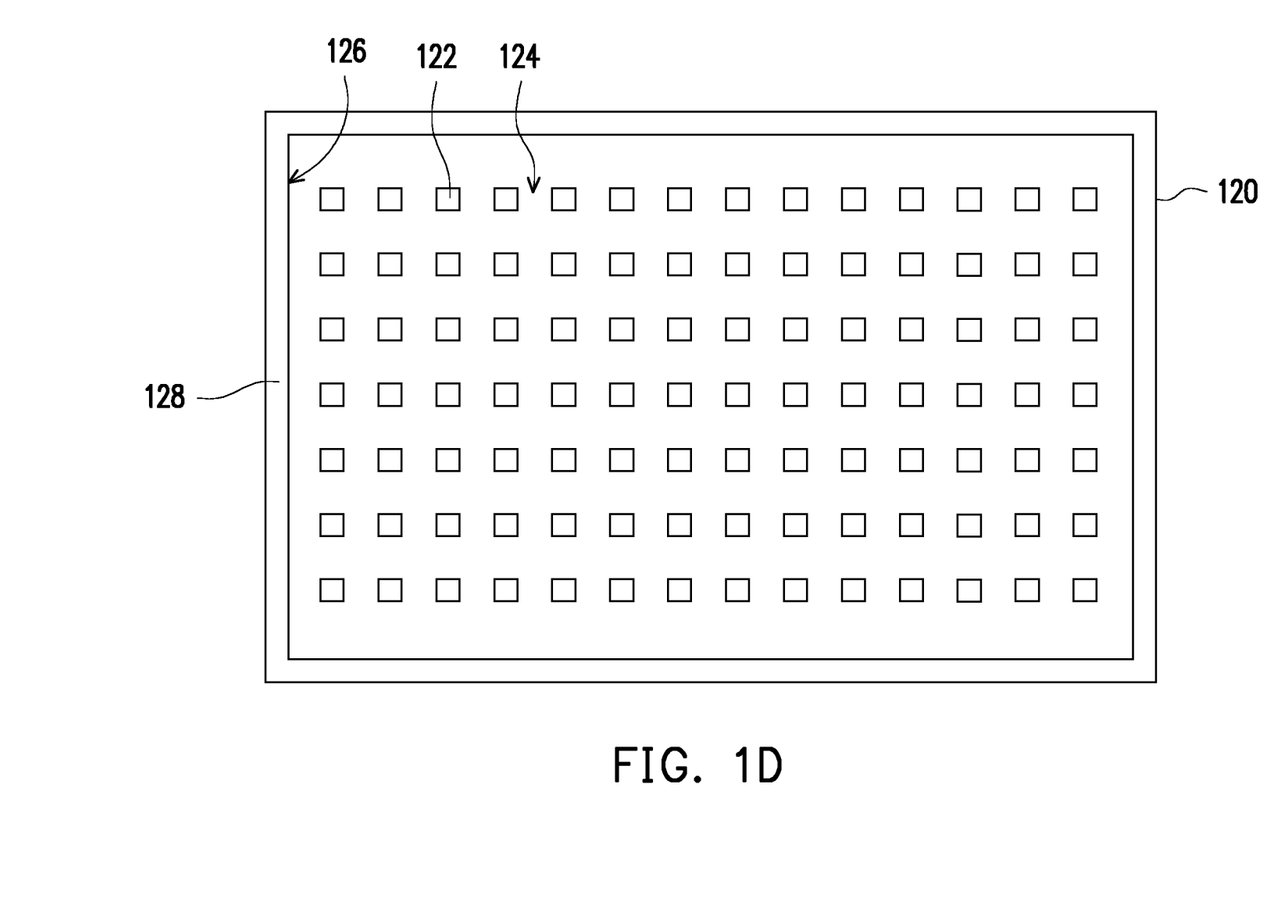
FIG. 1D is a schematic diagram of an inner surface of a second casing of the vapor chamber device of FIG. 1A.

FIG. 1D is a schematic diagram of an inner surface of a second casing of the vapor chamber device of FIG. 1A. With reference to FIG. 1D, in the present embodiment, shapes of the supporting posts 122 are uniformly and evenly distributed on the inner surface of the second plate 121, and a plurality of vapor channels 124 is formed between the supporting posts 122. The supporting posts 122 are, for example, square posts, but in other embodiments, the supporting posts 122 may also be rectangular posts, cylinders, elliptical posts, polygonal posts, tapered posts, irregular posts, or/and a combination thereof. Shapes and forms of distribution of the supporting posts 122 are not limited thereto. The supporting posts 122 are integrally formed with the second plate 121, but may alternatively be joined through other manners such as welding and depositing.

Figure 1E:
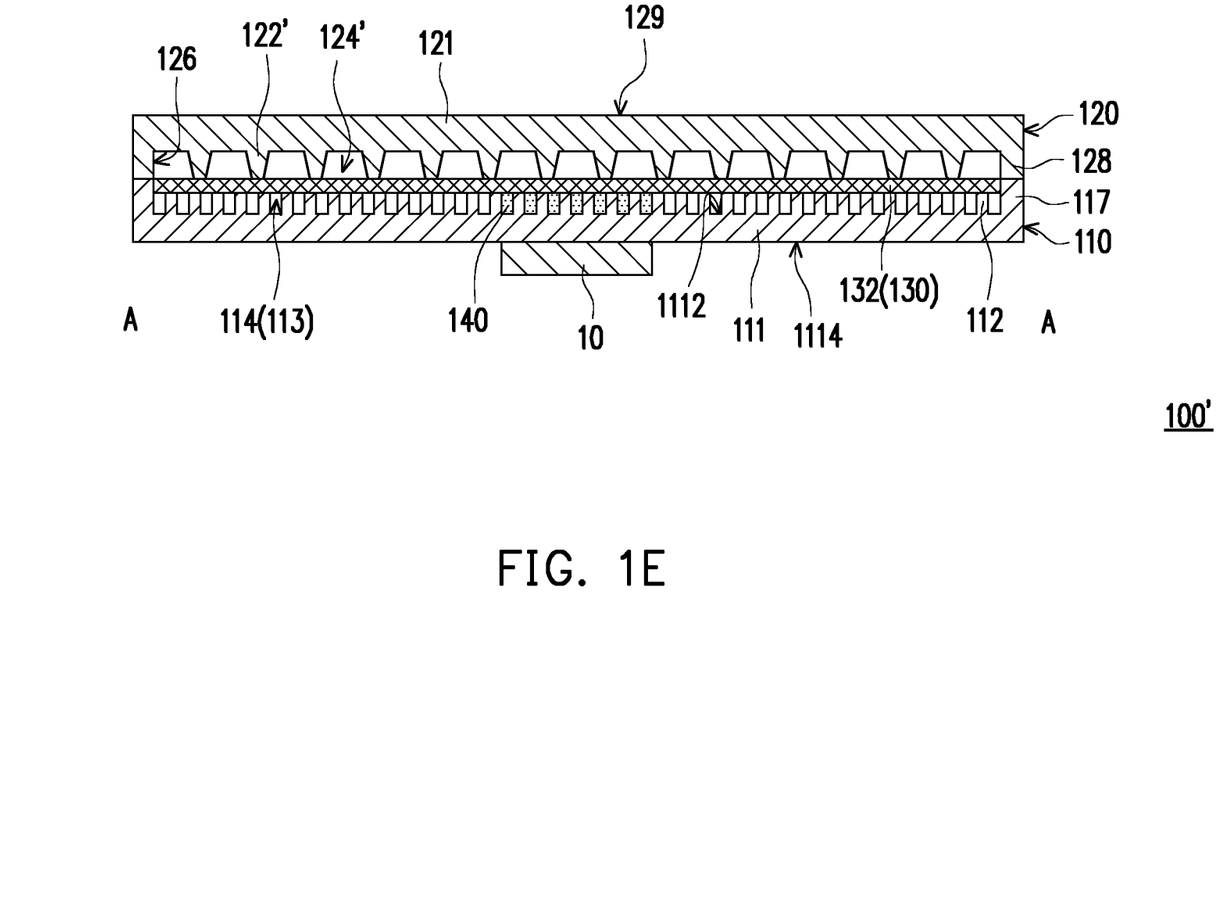
FIG. 1E is a schematic cross-sectional view of a vapor chamber device according to another embodiment of the disclosure.

FIG. 1E is a schematic cross-sectional view of a vapor chamber device according to another embodiment of the disclosure. Cross-sectional shapes of supporting posts 122' of a vapor chamber device 100' are inverted trapezoids, and therefore a cross-sectional shape of a constructed vapor channel 124' is trapezoidal. In other embodiments, the supporting posts 122' include a plurality of rectangular posts, a plurality of conical posts, a plurality of trapezoidal posts, a plurality of cylinders, or a plurality of irregular posts. Therefore, the cross-sectional shapes of the supporting posts 122' may be triangles, arcs, or other shapes. Similarly, the cross-sectional shape of the vapor channel 124' may be a triangle, an arc, or other shapes.

Returning to FIG. 1B, in the present embodiment, the supporting posts 122 face the first capillary structure 113. In addition, in the present embodiment, the first casing 110 and the second casing 120 are, for example, two metal casings, and the first lateral wall 117 is engaged with the second lateral wall 128 to provide favorable structural strength. A manner in which the first lateral wall 117 and the second lateral wall 128 is, for example, diffusion bonding or brazing, which should however not be construed as a limitation in the disclosure.

In the present embodiment, the first capillary structure 113 is slightly lower than the first lateral wall 117, and when the second capillary structure 130 is approximately flush with the first lateral wall 117 when being disposed on the first capillary structure 113, so that when the first lateral wall 117 is engaged with the second lateral wall 128, the supporting posts 122 may abut against the second capillary structure 130. Definitely, in other embodiments, the foregoing height relationship is not limited thereto.

It should be noted that, in the present embodiment, an appropriate amount of working fluid g such as water fills inner space surrounded by the first casing 110 and the second casing 120, but the type of the working fluid g is not limited thereto. For example, the working fluid g flows in the trench 114 of the first capillary structure 113 of the first casing 110 in a form of liquid. The working fluid g absorbs heat in an area close to the heat source 10 and evaporates into vapor.

Therefore, in the present embodiment, the supporting posts 122 abut against the second capillary structure 130, and may support the second plate 121, which may effectively prevent the first casing 110, the second casing 120, and the vapor channel 124 from being collapsed during evacuating. In addition, when the working fluid g is condensed into liquid from vapor, the working fluid g may also flow down along a lateral wall of the supporting post 122. In other words, the supporting posts 122 may also serve as a structure for guiding the working fluid g (liquid) to flow down.

In the present embodiment, the second capillary structure 130 is a mesh structure woven by a plurality of wires 132, such as a copper mesh. Definitely, in other embodiments, the second capillary structure 130 may also be a non-woven mesh or a porous metal foam capillary structure, and the form of the second capillary structure 130 is not limited thereto.

It is worth mentioning that in FIG. 1B, since the second capillary structure 130 is disposed on the trenches 114 of the first capillary structure 113, tops of the trenches 114 of the first capillary structure 113 are covered by the second capillary structure 130. However, a similar capillary structure is formed in a direction (a direction of emitting or injecting into the drawing surface) in which the trenches 114 extend, and the structure may enable the working fluid g in the trenches 114 to resist gravity and allow the vapor chamber device 100 to complete thermal cycle well under a non-horizontal condition.

In addition, in the present embodiment, the third capillary structure 140 is disposed in an area that is at the inner surface 1112 of the first plate 111 and that corresponds to the heat source 10. In particular, in the present embodiment, since the trenches 114 of the first capillary structure 113 are evenly distributed on the first plate 111, some (especially a central trench) of the trenches 114 correspond to the area that is on the first plate 111 and that corresponds to the heat source 10. Therefore, in the present embodiment, an area that is in the trenches 114 and corresponds to the heat source 10 is filled with the third capillary structure 140.

As shown in FIG. 1C, the second capillary structure 130 includes a plurality of holes 134. It should be noted that, in a cross section of FIG. 1B, wires 132 of the second capillary structure 130 are just cut, and the holes 134 cannot be seen. In a cross section of FIG. 1C, a relationship between the wires 132 of the second capillary structure 130 and the holes 134 may be observed. In addition, the cross section of FIG. 1C is just cut along one of the trenches 114 of the first capillary structure 113, and the protruding bars 112 cannot be seen in this section. The supporting posts 122 of the second casing 120 are not cut in FIG. 1C, and only the vapor channel 124 is shown.

The holes 134 corresponding to the heat source 10 are filled with the third capillary structure 140. In the present embodiment, a sintered capillary structure is taken as an example of the third capillary structure 140. For example, metal powders are sintered in a local area of the trenches 114 and the holes 134. Definitely, in other embodiments, the form of the third capillary structure 140 is not limited thereto. In addition, in an embodiment that is not illustrated, the second capillary structure 130 may also be a metal foam layer with a large number of holes inside, and the holes of the metal foam layer and the trenches 114 of the first capillary structure 113 are filled with the third capillary structure 140 (metal powders).

As shown in FIG. 1C, the outer surface 1114 (marked in FIG. 1B) of the first casing 110 of the vapor chamber device 100 is in contact with the heat source 10, heat generated by the heat source 10 is transferred to the first casing 110. An area that is of the vapor chamber device 100 and that corresponds to the heat source 10 is referred to as an evaporation area. In the evaporation area, the liquid in the trenches 114 absorbs heat and vaporizes into vapor. The working fluid g (vapor) flows upward to the vapor channel 124 of the second casing 120 and diffuse into an internal vapor cavity of the second casing 120, further condenses into a liquid in the condensing area (for example, the outer surface 129 of the second casing of the vapor chamber plate, or a selected area of the outer surface 1114 of the first casing that is not in contact with the heat source 10) of the vapor chamber plate, and the heat is discharged from the vapor chamber device 100. The condensed working fluid g (liquid) flows down to the trench 114 of the first casing 110 and flows through the trench 114 to the third capillary structure 140 to complete a cycle.

It is worth mentioning that, in the present embodiment, the trenches 114 of the first capillary structure 113 and the holes 134 of the second capillary structure 130 in the evaporation area are filled with the third capillary structure 140. Since the third capillary structure 140 provides strong capillary force, the working fluid g may be easily sucked into the evaporation area, to avoid a case that the vaporized liquid in the evaporation area cannot be supplemented in time, thereby providing good anti-drying capability. In addition, the trenches 114 of the first capillary structure 113 and the holes 134 of the second capillary structure 130 are not provided with a third capillary structure 140 outside an area corresponding to the heat source 10, so that a low flow resistance may be maintained.

In this way, the foregoing design of the vapor chamber device 100 may greatly increase the maximum heat dissipation amount without increasing the thickness (the thickness of the first capillary structure 113 and the second capillary structure 130 may be maintained), and may be applied to a thin device. Through testing, in comparison with the vapor chamber without the third capillary structure 140, the maximum heat dissipation amount of the vapor chamber device 100 of the present embodiment may be increased by at least 50%, so that the vapor chamber device has improved performance.

The working fluid evaporates in the capillary structure close to the heat source, and the formed vapor passes through the cross-shaped vapor flow channel formed between the plurality of supporting posts of the second plate, diffuses to the vapor cavity inside the entire vapor chamber, and further condenses into a liquid in the condensing area of the vapor chamber, and the heat is discharged from the vapor chamber device. The condensed liquid passes through the capillary structure below, flows back to the area near the heat source, and evaporates, to complete a thermal cycle. Since the third capillary structure corresponding to the heat source area has stronger capillary force, and the trenches that are in the first capillary structure and that are covered by the second capillary structure have both lower flow resistance and stronger capillary force, the three capillary structures are properly matched, so that the working fluid may flow back to the evaporation area near the heat source more quickly, and the evaporation area of the vapor chamber device is less easier to dry out and has more favorable heat dissipation efficiency.

A vapor chamber device in another pattern or a second casing thereof is described below. Same or similar elements as the previous embodiment are denoted by same or similar symbols. The descriptions thereof are omitted herein, and only main differences are described.

Figure 2A:
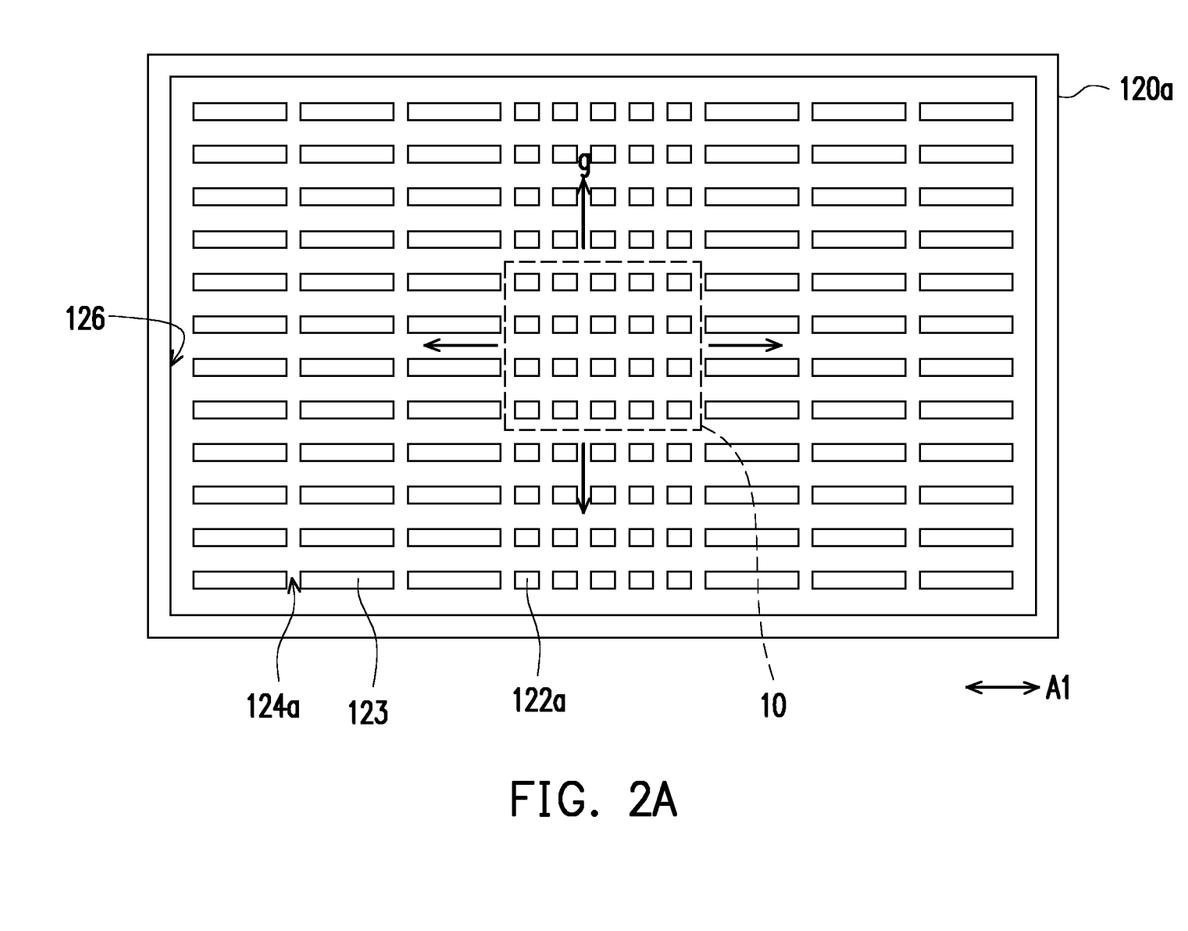
FIG. 2A and FIG. 2B are schematic diagrams of a second casing of a plurality of vapor chamber devices according to other embodiments of the disclosure.
Figure 2B:
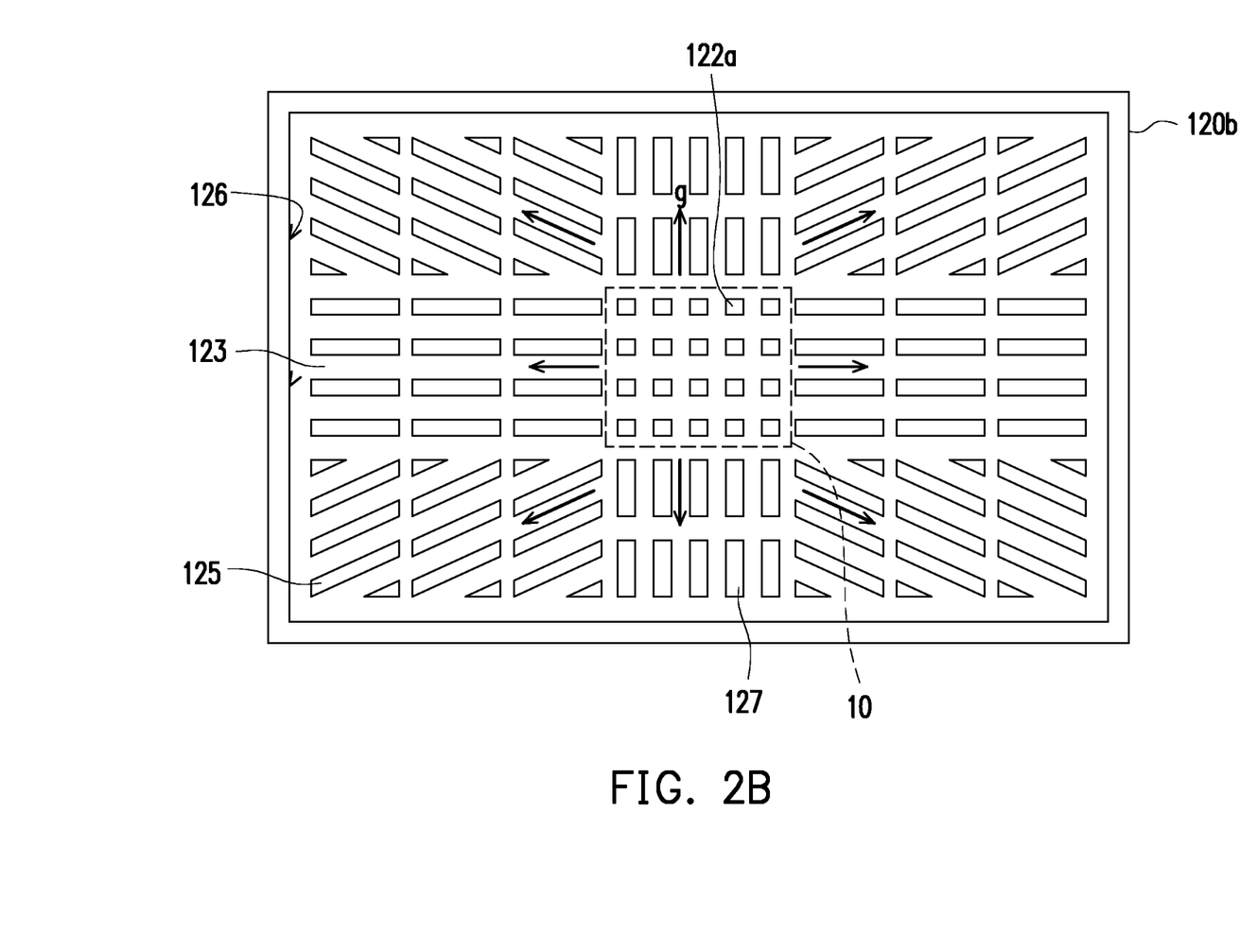

FIG. 2A and FIG. 2B are schematic diagrams of a second casing of a plurality of vapor chamber devices according to other embodiments of the disclosure. With reference to FIG. 2A first, a main difference between the second casing 120a of FIG. 2A and the second casing 120 of FIG. 1D is that, in the present embodiment, these supporting posts include a plurality of first supporting posts 122a and a plurality of second supporting posts 123, and a shape of the first supporting post 122a is different from a shape of the second supporting post 123. The first supporting posts 122a are disposed corresponding to the heat source 10, and the second supporting posts 123 are located beside the first supporting posts 122a and extend along an axial direction A1.

In the present embodiment, the second casing 120a is provided with densely populated first supporting posts 122a corresponding to the heat source 10, so as to provide good structural strength. The second supporting posts 123 are disposed on both sides of the first supporting posts 122a and extend along the axial direction A1 to guide a flow direction of the working fluid g (vapor).

With reference to FIG. 2B, a main difference between the second casing 120b of FIG. 2B and the second casing 120a of FIG. 2A is that, in the present embodiment, one portion (the first supporting posts 122a) of these supporting posts is disposed corresponding to the heat source 10, and the other portion of the supporting posts (the second supporting posts 123, 125, and 127) is radially arranged around the first supporting posts 122a as a center. Such a design may also well guide the flow direction of the working fluid g (vapor).

Figure 2C:
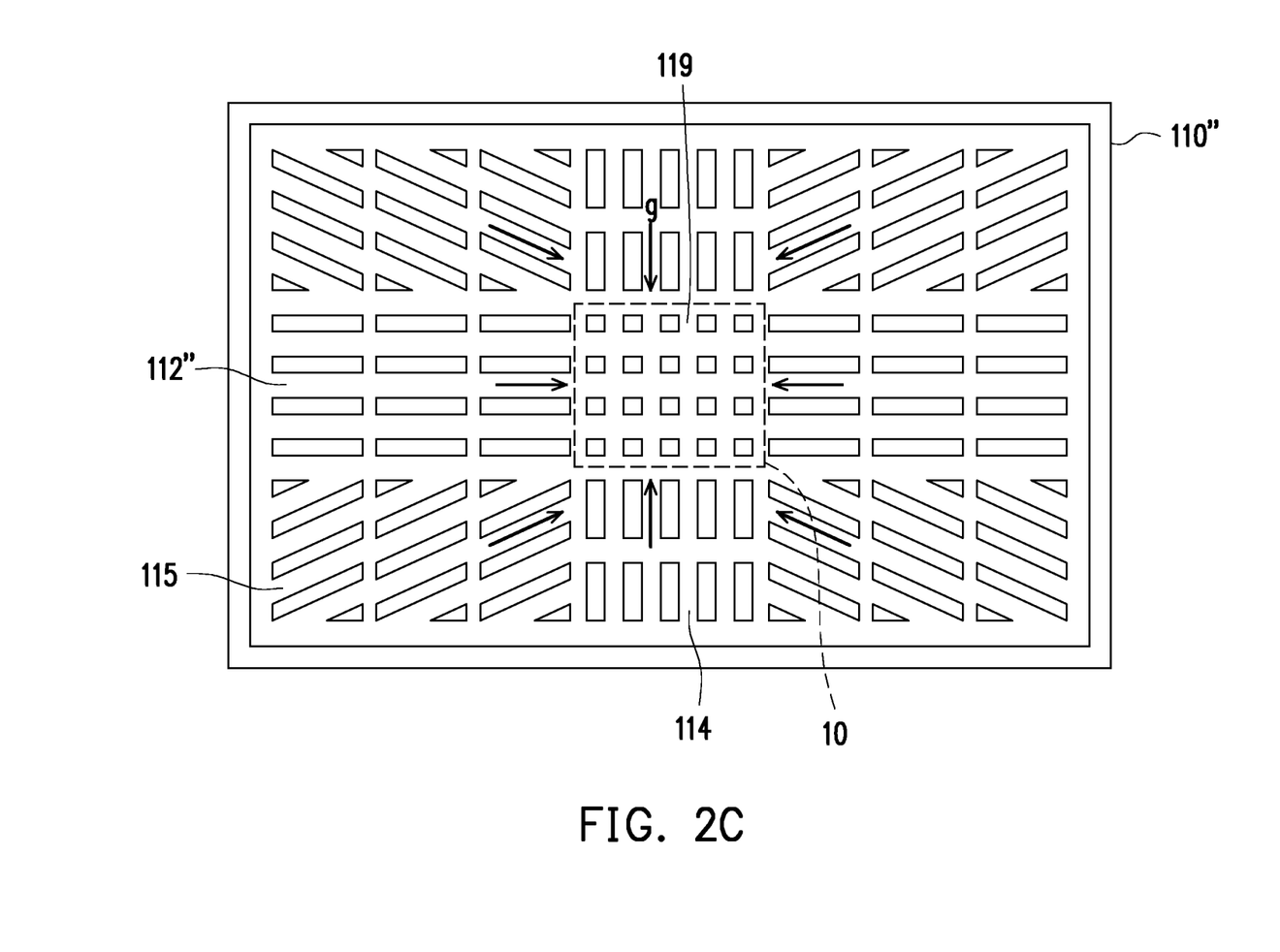
FIG. 2C is a schematic diagram of an inner surface of a first casing of a vapor chamber device according to other embodiments of the disclosure.

FIG. 2C is a schematic diagram of an inner surface of a first casing of a vapor chamber device according to other embodiments of the disclosure. With reference to FIG. 2C, in the present embodiment, the first casing 110" has trenches 114, 112", 115, 118, and 119 with a plurality of different directions, and the trenches are radial to reduce the flow resistance and allow the condensed liquid to flow back quickly. The arrangement pattern of the trenches on the inner surface of the first casing is not limited to a radial pattern, and any arrangement pattern sufficient to guide the working fluid g (liquid) may be applicable.

Figure 3:
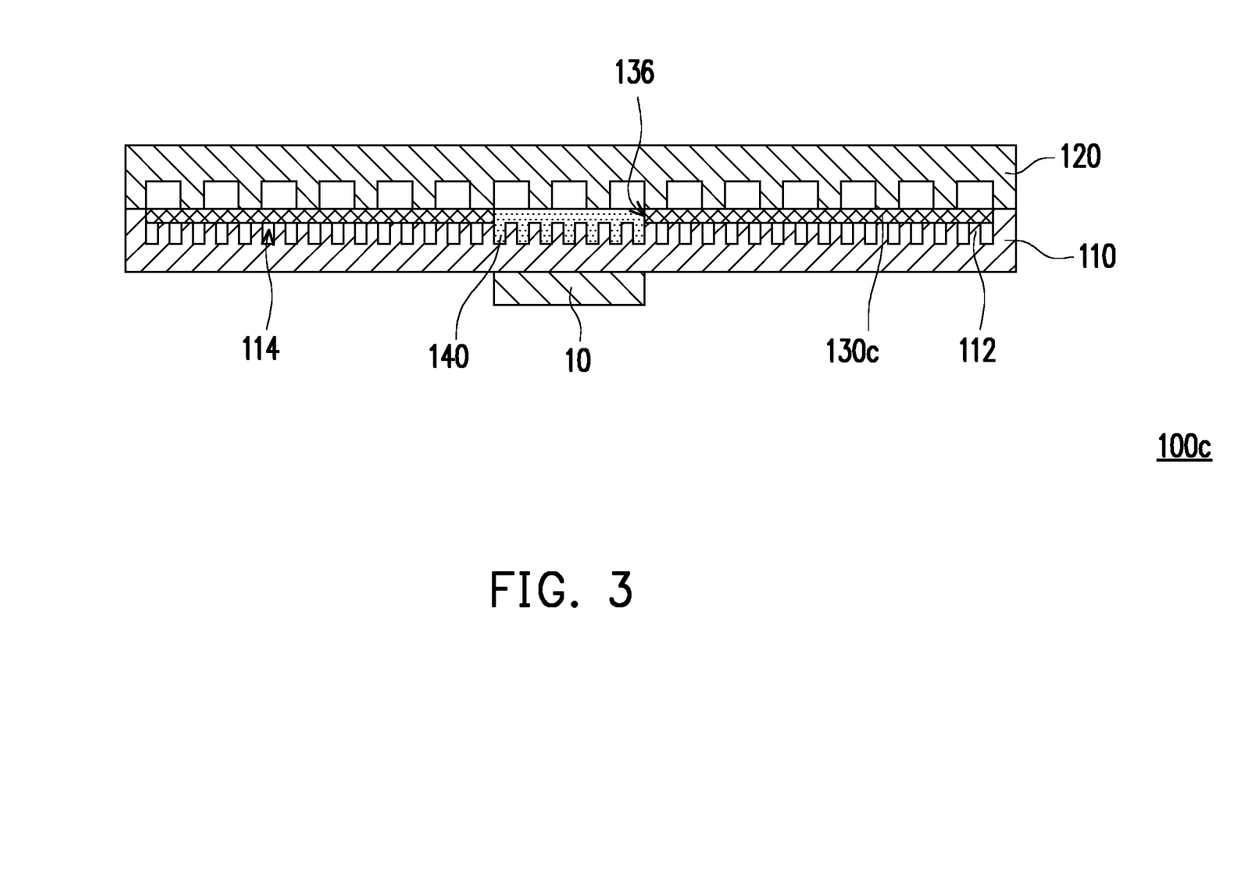
FIG. 3 is a schematic diagram of a vapor chamber device according to another embodiment of the disclosure.

FIG. 3 is a schematic diagram of a vapor chamber device according to another embodiment of the disclosure. With reference to FIG. 3, a main difference between a vapor chamber device 100c of FIG. 3 and the vapor chamber device 100 of FIG. 1B is that, in the present embodiment, a second capillary structure 130c has an opening 136 corresponding to a heat source 10, and the entire opening 136 is filled with a third capillary structure 140. In other words, in the present embodiment, the capillary structure that is in the evaporation area and that corresponds to the heat source 10 is mainly composed of the trenches 114 and the third capillary structure 140.

Figure 4:
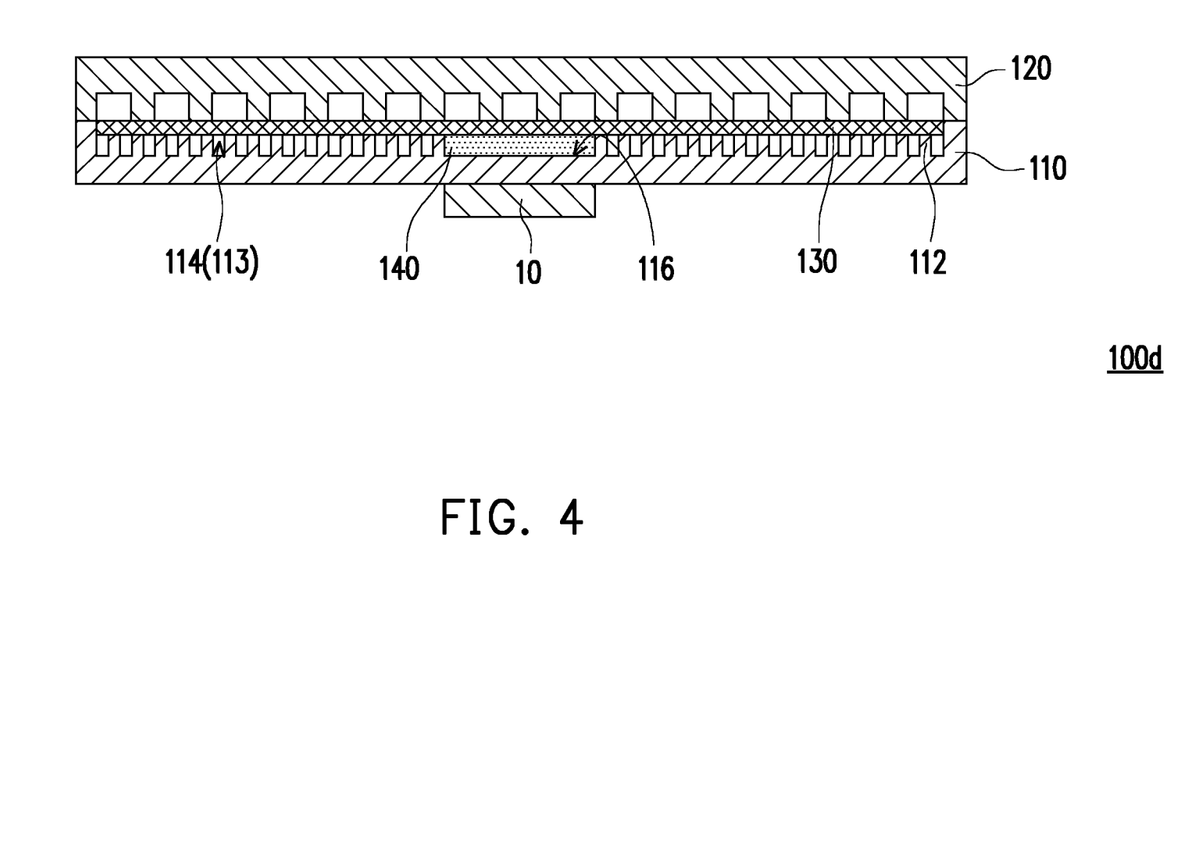
FIG. 4 is a schematic diagram of a vapor chamber device according to another embodiment of the disclosure.

FIG. 4 is a schematic diagram of a vapor chamber device according to another embodiment of the disclosure. With reference to FIG. 4, a main difference between a vapor chamber device 100d of FIG. 4 and the vapor chamber device 100 of FIG. 1B is that, in the present embodiment, a first casing 110 has a cavity 116 corresponding to a heat source 10, and a first capillary structure 113 is located outside the cavity 116. The cavity 116 and the holes 134 (marked in FIG. 1C) corresponding to the heat source 10 are filled with the third capillary structure 140. In other words, in the present embodiment, the capillary structure that is in the evaporation area and that corresponds to the heat source 10 is mainly composed of the second capillary structure 130 and the third capillary structure 140.

Figure 5:
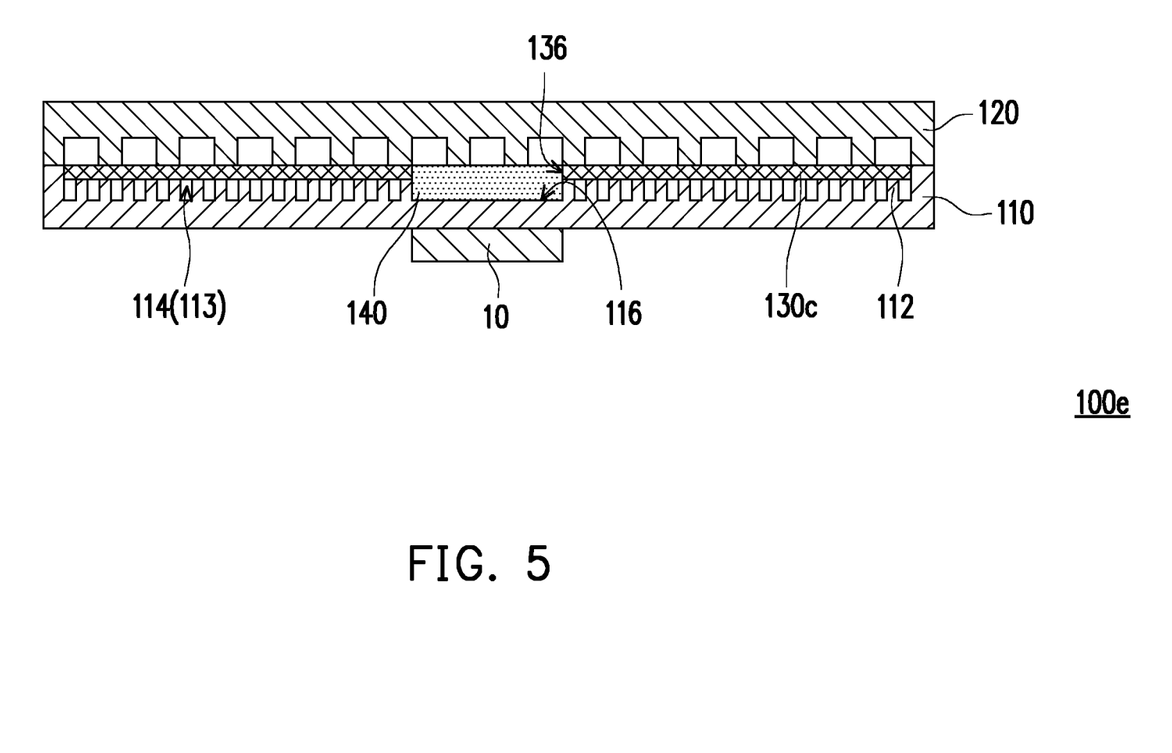
FIG. 5 is a schematic diagram of a vapor chamber device according to another embodiment of the disclosure.

FIG. 5 is a schematic diagram of a vapor chamber device according to another embodiment of the disclosure. With reference to FIG. 5, a main difference between the vapor chamber device 100e of FIG. 5 and the vapor chamber device 100d of FIG. 4 is that, in the present embodiment, a second capillary structure 130c has an opening 136 corresponding to a heat source 10, and the entire opening 136 is filled with a third capillary structure 140. In other words, in the present embodiment, the capillary structure that is in the evaporation area and that corresponds to the heat source 10 is mainly composed of the third capillary structure 140.

A contact surface of the first capillary structure and the second capillary structure may be sintered or bonded by thermocompression, and the third capillary structure between the first capillary structure and the second capillary structure may also be sintered to enhance the structural strength and heat-conducting performance.

Based on the above, for the vapor chamber device of the disclosure, in addition to the first capillary structure and the second capillary structure disposed between the first casing and the second casing to improve heat dissipation efficiency, the third capillary structure is further disposed in an area that is at the inner surface of the first plate and that corresponds to the heat source. With the third capillary structure, the liquid disposed in the vapor chamber device may be subject to greater capillary force and supplemented to the area more quickly, to improve the anti-drying capability of the area. Therefore, a sufficient amount of liquids may be maintained in the area for phase changes, and a probability that the vaporized liquid in the area cannot be supplemented to the area in time to cause excessive temperature rise of the heat source may be reduced. In this way, the vapor chamber device of the disclosure may exhibit better heat dissipation efficiency.

What is claimed is:

1. A vapor chamber device adapted to be thermally coupled to a heat source, the vapor chamber device comprising:

a first casing comprising a first plate, a first capillary structure at an inner surface of the first plate, and a first lateral wall protruding from the inner surface and surrounding the first capillary structure, wherein the heat source is adapted to be in contact with an outer surface of the first plate, and the first capillary structure serves as a liquid channel;

a second casing stacked on the first casing and comprising a second plate, a plurality of supporting posts protruding from the second plate, and a second lateral wall protruding from the second plate and surrounding the supporting posts, wherein a plurality of vapor channels are formed between the supporting posts, the supporting posts face towards the first capillary structure, and the first lateral wall is connected to the second lateral wall;

a second capillary structure disposed between the first capillary structure and the supporting posts of the second casing; and a third capillary structure disposed at the inner surface of the first plate and corresponding to the heat source, wherein the first plate is entirely integrally formed, wherein the first capillary structure comprises a plurality of trenches formed between a plurality of protruding bars, a first area which is in the trenches and corresponds to the heat source is filled with the third capillary structure, a second area which is in the trenches and does not correspond to the heat source is not filled with the third capillary structure, and the third capillary structure comprises metal powders or non-woven metal wool, wherein the second capillary structure comprises an opening corresponding to the heat source, and the opening is filled with the third capillary structure.

2. The vapor chamber device according to claim 1, wherein the supporting posts are evenly distributed on the second plate.

3. The vapor chamber device according to claim 1, wherein the supporting posts comprise a plurality of first supporting posts and a plurality of second supporting posts, a shape of the first supporting posts is different from a shape of the second supporting posts, the first supporting posts are disposed corresponding to the heat source, and the second supporting posts are located beside the first supporting posts and extend along an axial direction.

4. The vapor chamber device according to claim 1, wherein one portion of the supporting posts is disposed corresponding to the heat source, and the other portion of the supporting posts is radially arranged around the one portion of the supporting posts as a center.

5. The vapor chamber device according to claim 1, wherein the supporting posts comprise a plurality of rectangular posts, a plurality of conical posts, a plurality of trapezoidal posts, a plurality of cylinders, or a plurality of irregular posts.

6. The vapor chamber device according to claim 1, wherein at least one portion of the trenches is radially arranged.

7. A vapor chamber device adapted to be thermally coupled to a heat source, the vapor chamber device comprising:

a first casing comprising a first plate, a first capillary structure at an inner surface of the first plate, and a first lateral wall protruding from the inner surface and surrounding the first capillary structure, wherein the heat source is adapted to be in contact with an outer surface of the first plate, and the first capillary structure serves as a liquid channel;

a second casing stacked on the first casing and comprising a second plate, a plurality of supporting posts protruding from the second plate, and a second lateral wall protruding from the second plate and surrounding the supporting posts, wherein a plurality of vapor channels are formed between the supporting posts, the supporting posts face towards the first capillary structure, and the first lateral wall is connected to the second lateral wall;

a second capillary structure disposed between the first capillary structure and the supporting posts of the second casing; and a third capillary structure disposed at the inner surface of the first plate and corresponding to the heat source, wherein the first plate is entirely integrally formed, wherein the first capillary structure comprises a plurality of trenches formed between a plurality of protruding bars, a first area which is in the trenches and corresponds to the heat source is filled with the third capillary structure, a second area which is in the trenches and does not correspond to the heat source is not filled with the third capillary structure, and the third capillary structure comprises metal powders or non-woven metal wool, wherein the supporting posts comprise a plurality of first supporting posts and a plurality of second supporting posts, a shape of the first supporting posts is different from a shape of the second supporting posts, the first supporting posts are disposed corresponding to the heat source, and the second supporting posts are located beside the first supporting posts and extend along an axial direction.

8. The vapor chamber device according to claim 7, wherein the supporting posts comprise a plurality of rectangular posts, a plurality of conical posts, a plurality of trapezoidal posts, a plurality of cylinders, or a plurality of irregular posts.

9. The vapor chamber device according to claim 7, wherein at least one portion of the trenches is radially arranged.

* * * * *